US006678859B1

(12) United States Patent
Senshu (10) Patent No.: US 6,678,859 B1
(45) Date of Patent: Jan. 13, 2004

(54) OPTICAL DISK APPARATUS AND DATA READING METHOD

(75) Inventor: Susumu Senshu, Kanagawa (JP)

(73) Assignee: Sony Corporation, Tokyo (JP)

( * ) Notice: Subject to any disclaimer, the term of this patent is extended or adjusted under 35 U.S.C. 154(b) by 450 days.

(21) Appl. No.: 09/718,038

(22) Filed: Nov. 20, 2000

(30) Foreign Application Priority Data

Nov. 22, 1999 (JP) .............................. 11-331891

(51) Int. Cl.[7] .................. H03M 13/29; G11C 29/00
(52) U.S. Cl. ............................ 714/761; 714/769
(58) Field of Search ............................ 714/704, 752, 714/761, 769, 780

(56) References Cited

U.S. PATENT DOCUMENTS

| 3,774,154 | A | * | 11/1973 | Devore et al. ............... 714/769 |
|---|---|---|---|---|
| 4,852,099 | A | * | 7/1989 | Ozaki ........................... 714/756 |
| 5,216,677 | A | * | 6/1993 | Takagi et al. ................. 714/765 |
| 5,271,021 | A | * | 12/1993 | Berlekamp et al. .......... 714/784 |
| 5,271,022 | A | * | 12/1993 | Berlekamp et al. .......... 714/755 |
| 5,623,507 | A | * | 4/1997 | Burns et al. .................. 714/765 |
| 5,926,489 | A | * | 7/1999 | Luthi et al. .................. 375/346 |
| 6,349,400 | B1 | * | 2/2002 | Senshu ......................... 714/769 |
| 6,363,511 | B1 | * | 3/2002 | Massoudi ..................... 714/755 |
| 6,415,411 | B1 | * | 7/2002 | Nakamura .................... 714/755 |
| 6,446,236 | B1 | * | 9/2002 | McEwen et al. ............. 714/795 |
| 6,546,519 | B2 | * | 4/2003 | Senshu ......................... 714/769 |

* cited by examiner

Primary Examiner—R. Stephen Dildine
(74) Attorney, Agent, or Firm—Frommer Lawrence & Haug LLP; William S. Frommer; Gordon Kessler

(57) ABSTRACT

An optical disk apparatus reads data written in an optical disk in units of code blocks arranged by joining a plurality of correcting codes. The optical disk apparatus includes a reading unit for reading the code block from the optical disk and an error correcting unit for combining first error correcting processing performed on the code block read by the reading unit with second error correcting processing performed by adding remove information to codes that cannot be corrected during at least the first error correcting processing.

5 Claims, 9 Drawing Sheets

OPTICAL DISK APPARATUS AND DATA READING METHOD

BACKGROUND OF THE INVENTION

1. Field of the Invention

The present invention relates to an optical disk apparatus which reads data in units of code blocks arranged by joining a plurality of error-correcting codes from an optical disk.

2. Description of the Related Art

In the past, in an optical disk apparatus in which information is read from and written to an optical disk, the bit error rate of user data has been improved sufficiently enough for practical use by means of predetermined error correcting codes.

Figure 8:
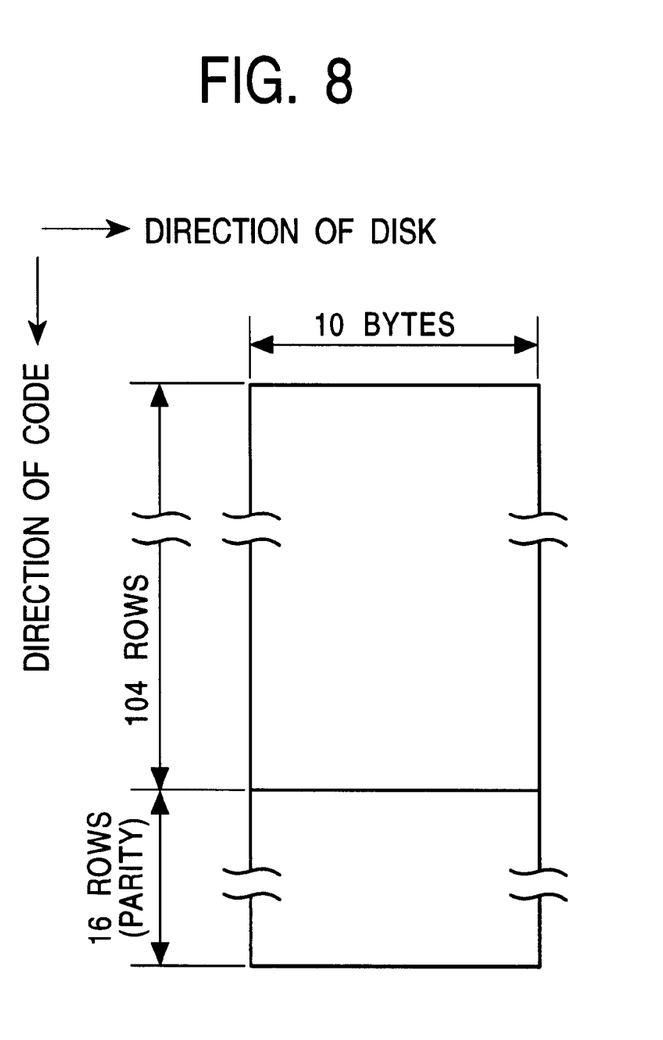
FIG. 8 is a diagram showing an optical-disk sector format established by the ISO.

FIG. 8 shows a sector format for an optical disk established by the International Organization for Standardization (ISO). In FIG. 8, only relations between the user data and the error correcting code are shown, and illustrations of an address unit, a gap, a VFO (variable frequency oscillator), a synchronizing signal, and the like are omitted. The optical disk apparatus arranges blocks of user data that are successively input, forms an ECC (Error Correcting Code) block by adding the error correcting code based on LDC (Long Distance Code) to the arranged blocks, and then records the user data on the optical disk specified according to the sector format shown in FIG. 8 by allocating one ECC block to one sector.

The optical disk apparatus forms one ECC block using ten interleave lines. The code size of each interleave line is 120 words (eight bits of data constitutes one word) in which 104 words are allocated for the user data and 16 words are allocated for the error correcting code (parity) using the LDC. The optical disk apparatus sets 120×10 words for one ECC block as recording words for the optical disk, adds 16 words of control data to the ECC block, and then assigns the resultant ECC block to each sector of the optical disk.

Interleave is applied to data in the direction of the disk. Here, the correcting is one-pass normal correcting. In order to perform more efficient correcting, combined correcting may be considered using a remove flag obtained from information other than coding information, such as servo error, RF signal degradation of data, and out-of-synchronization information.

Figure 9:
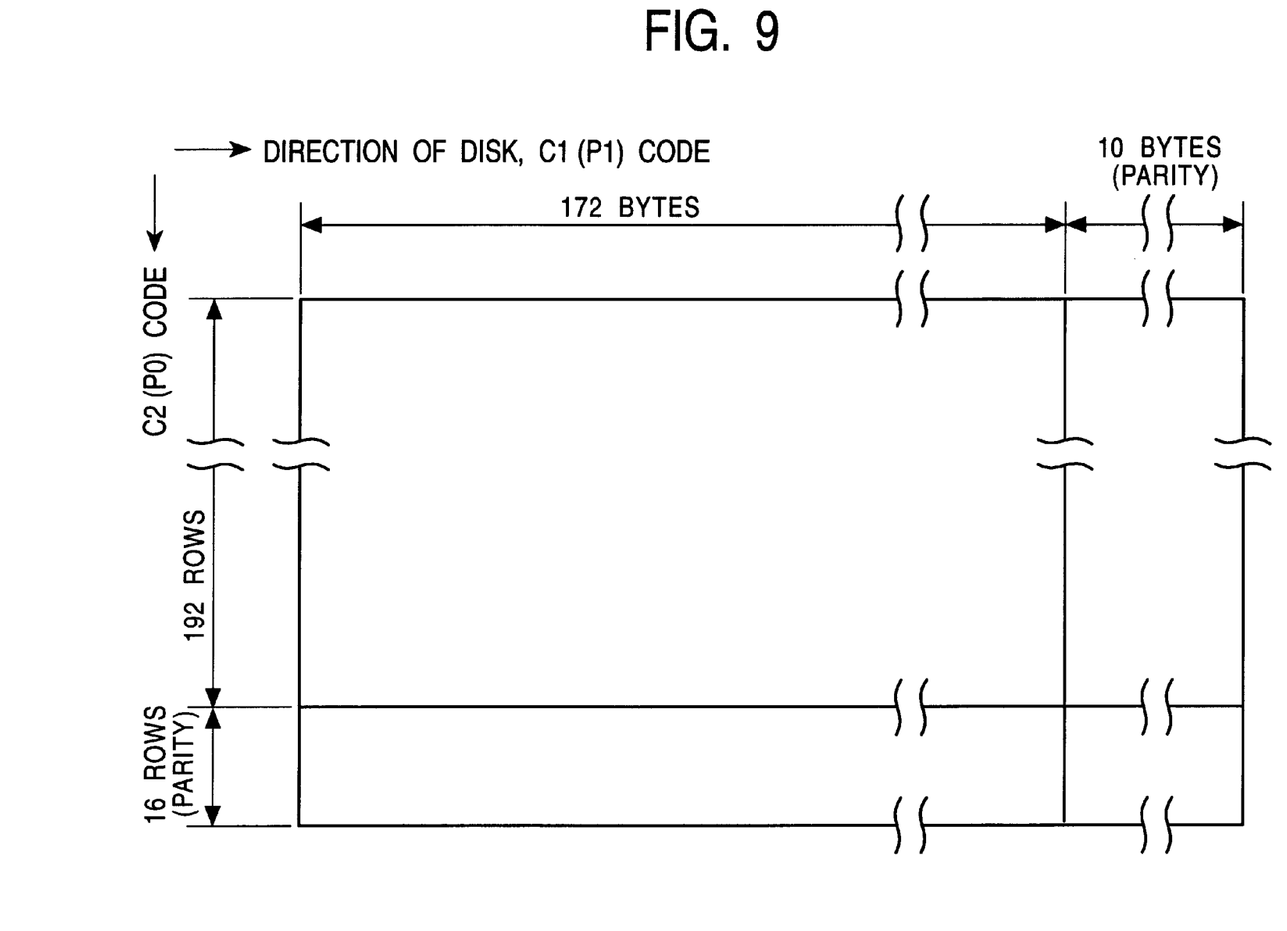
FIG. 9 is a format diagram of the ECC block for a DVD.

FIG. 9 shows the ECC block format of a digital versatile disk (DVD). The DVD uses a PRC (product code) as the error correcting code. Random error correcting is performed along with checks for burst errors in accordance with C1 (which is a correction-code direction in the direction of the disk). When the code cannot be corrected, the remove flag is added to C1 code series and then combined correcting is performed in the C2 direction (which is a correction-code direction in which interleave is applied). The correcting can be repeated.

Recently, optical disks and optical disk apparatuses with large capacity and high transfer speed have been desired particularly for use with moving pictures and the like. As a method for increasing the capacity of the optical disk, high-density recording which is obtained by shortening the wavelength of a light source or by increasing the numerical apertures of writing/reading beams of the optical system may be considered. When the numerical aperture of the writing/reading beams of the optical system are increased, it is preferable that the thickness of the substrate of the disk be thinned so that a skew margin and the like can be obtained.

When the disk has a higher density and the thickness of the optical disk becomes thinner, the disk is susceptible to dust, flaws, and the like. Therefore, the error-correcting ability thereof must be increased. Specifically, the error-correcting ability for burst errors must be high.

By setting the code length to be long, the error-correcting ability is increased. By setting the interleave length to be long, the error-correcting ability, particularly for the burst error, is increased. That is, by increasing the size of the ECC block, the error-correcting ability is expected to be increased in a system in which the burst errors are dominant.

When the error correcting is performed using the LDC as the error correcting code, even though the remove information other than coding information (obtained from external information) is used to increase the correcting efficiency, because the external information, such as servo error, RF signal degradation of data, and out-of-synchronization information does not necessarily agree with the data error, the validity of the remove information is sometimes uncertain.

When the error correcting is performed using the PRC as the error correcting code, the C2 correcting ability must be secured in the system in which burst errors are dominant. In a system in which random errors are less influential than burst errors, although less C1 correcting ability is required, the C1 parity becomes important for detecting burst errors. However, the existence of the C1 parity reduces the user data efficiency of the code block. When the user data efficiency is fixed at a certain level, correcting abilities of C1 and C2, that is, parity balance, sensitively affect relations between error characteristics (for example, whether the dominant error is burst errors or random errors) and correcting results.

Shortening of the wavelength of the light source, increasing the numerical aperture of the writing/reading beams in the optical system, and the like enable a code block having 64 Kbytes or more of user data to be recorded in one track of the innermost track of a data region of a 12 cm disk (which is equivalent to a DVD).

In order to increase the correcting ability as much as possible, it is preferable to use as large a code block as possible. However, in RS (Reed Solomon) code employing a common GF($2^8$), it is difficult to arrange a code block having 64 Kbytes or more of user data unlike the typical DVD using the PRC.

Although as high an increase as possible in the capacity of the optical disk is desired, significant reduction in the coding efficiency and increase in redundancy are not desired. In addition, as high an increase as possible in the correcting ability is desired. Particularly, an increase in the correcting efficiency for burst errors is desired. Efficient burst-error correcting is desired for securing the random-error correcting ability as well. That is, a correcting method for checking for burst errors and performing remove correction without changing the common LDC format is desired.

SUMMARY OF THE INVENTION

Accordingly, it is an object of the present invention to provide an optical disk apparatus and a data reading method which are capable of improving error-correcting ability even though excessive dust, flaws, and the like cause more than expected occurrence of errors in a large data volume of the optical disk.

To this end, according to a first aspect of the present invention, there is provided an optical disk apparatus for reading data written in an optical disk in units of code blocks arranged by joining a plurality of correcting codes. The optical disk apparatus includes a reading unit for reading the code block from the optical disk and an error correcting unit for combining first error correcting processing performed on the code block read by the reading unit with second error correcting processing performed by adding remove information to codes that cannot be corrected during at least the first error correcting processing.

According to a second aspect of the present invention, a data reading method reads data written in an optical disk in units of code blocks arranged by joining a plurality of correcting codes. The data reading method includes an error correcting step of combining first error correcting processing performed on the code block read from the optical disk with second error correcting processing performed by adding remove information to codes that cannot be corrected during at least the first error correcting processing.

Further objects, features, and advantages of the present invention will become apparent from the following description of the preferred embodiments with reference to the attached drawings.

DESCRIPTION OF THE PREFERRED EMBODIMENTS

Figure 1:
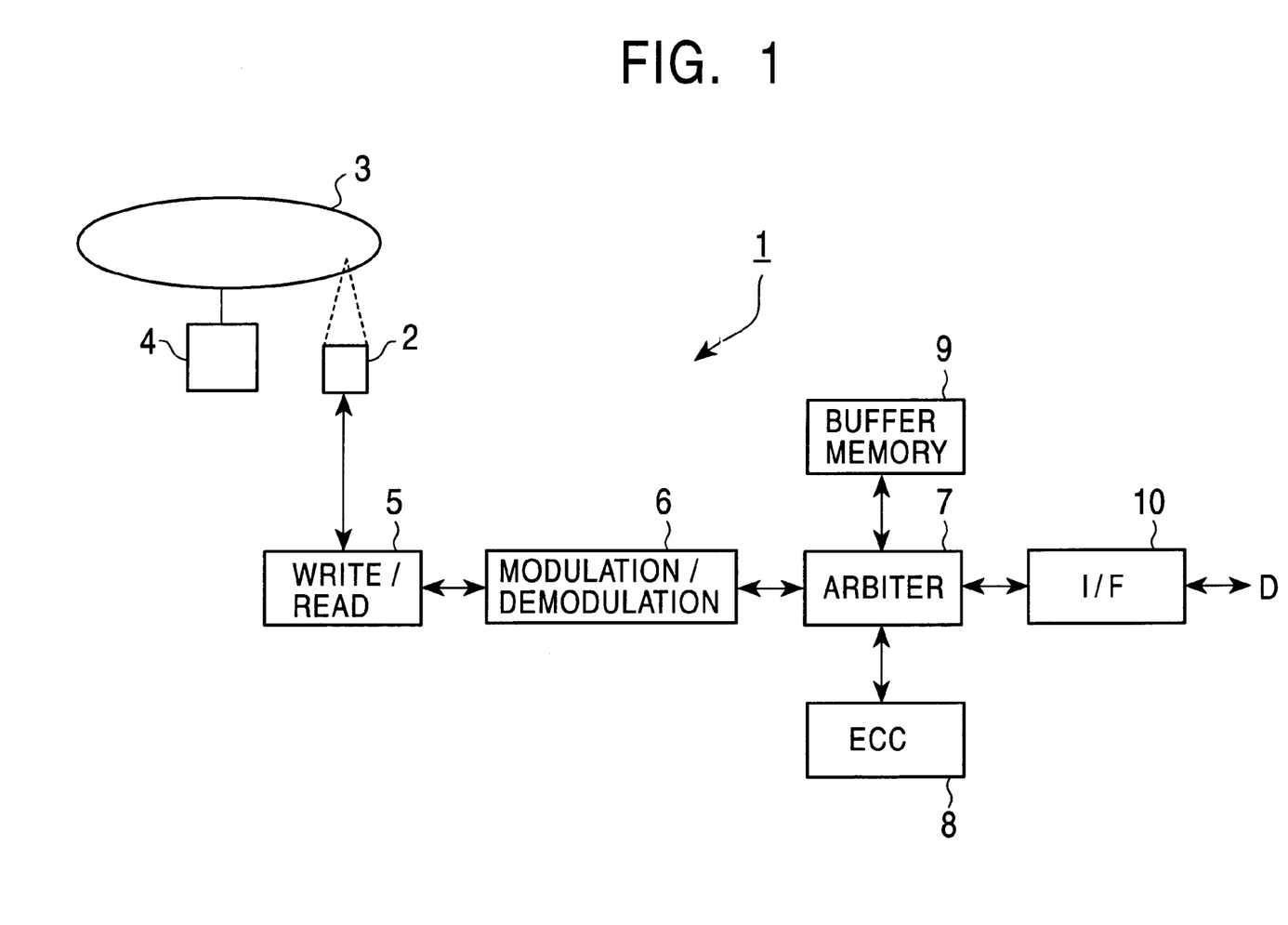
FIG. 1 is a block diagram of an optical disk apparatus according to the present invention.

As shown in FIG. 1, an optical disk apparatus 1 writes user data D1, which is successively input from an external device such as a computer, to an optical disk 3 via an interface (I/F) 10 by means of an optical pickup 2 which has a high numerical aperture. The apparatus 1 reads data recorded on the optical disk 3 and outputs it via the I/F 10.

The optical disk 3 is obtained by laminating a transparent disk substrate, an information recording face, and a rear-face protective substrate so that the overall thickness of the disk 3 is set to be 1.2 mm, the thickness of the transparent disk substrate being 0.1 mm. The transparent disk substrate is designed to allow a laser beam radiated from the optical pickup 2 to pass therethrough so that the beam is incident on the information recording face. This enables the optical disk 3 to reduce influences due to skew even though information is recorded in high density by setting the numerical aperture (NA) of the optical pickup 2 to be high.

The optical disk 3 has a groove formed on the information recording face thereof. The groove serves as a guiding groove for the laser beam and meanders on the optical disk 3. The optical disk apparatus 1 performs tracking control on the laser beam based on this groove as a reference. Furthermore, the optical disk apparatus 1 performs spindle control on a spindle motor 4 based on the meandering of the groove so that the optical disk 3 can be rotationally driven at a predetermined rotational speed. For example, the address of the radiation position of the laser beam can be detected by detecting the displacement of the meandering groove.

The optical pickup 2 is constructed so that the laser beam is focused on the information recording face via the optical system having a high numerical aperture. When receiving return light of this laser beam, the optical pickup 2 generates a tracking error signal whose signal level varies in accordance with the amount of the tracking error and a focus error signal whose signal level varies in accordance with the amount of focus error. The optical system is driven based on the tracking error signal and the focus error signal, so that tracking control and focus control are performed.

During writing, the optical pickup 2 sequentially forms pits corresponding to modulation signals on the information recording face of the disk 3 by intermittently increasing the intensity of the laser beam in accordance with the modulation signals output from a writing/reading circuit 5. When the pits are sequentially formed, since the optical pickup 2 radiates a laser beam having a short wavelength via the optical system with a high numerical aperture, user data D is written at high density.

During reading, the optical pickup 2 radiates a constant intensity of laser beam and outputs a read signal whose signal level varies in accordance with the amount of return light. However, since the thickness of the disk substrate is small, the signal level of the read signal RF varies due to dust, flaws, and the like, which causes the error rate of the read data of the optical disk apparatus 1 to be degraded compared to conventional apparatuses.

In the writing/reading system, a buffer memory 9 serves to temporarily store the user data D which is exchanged between the apparatus 1 and the external device.

During writing, an ECC (Error Correcting Circuit) 8 receives the user data D via the buffer memory 9 in which an arbiter 7 controls exchange of the data. The ECC converts the user data D into an ECC block having a format shown in FIG. 2.

Figure 2:
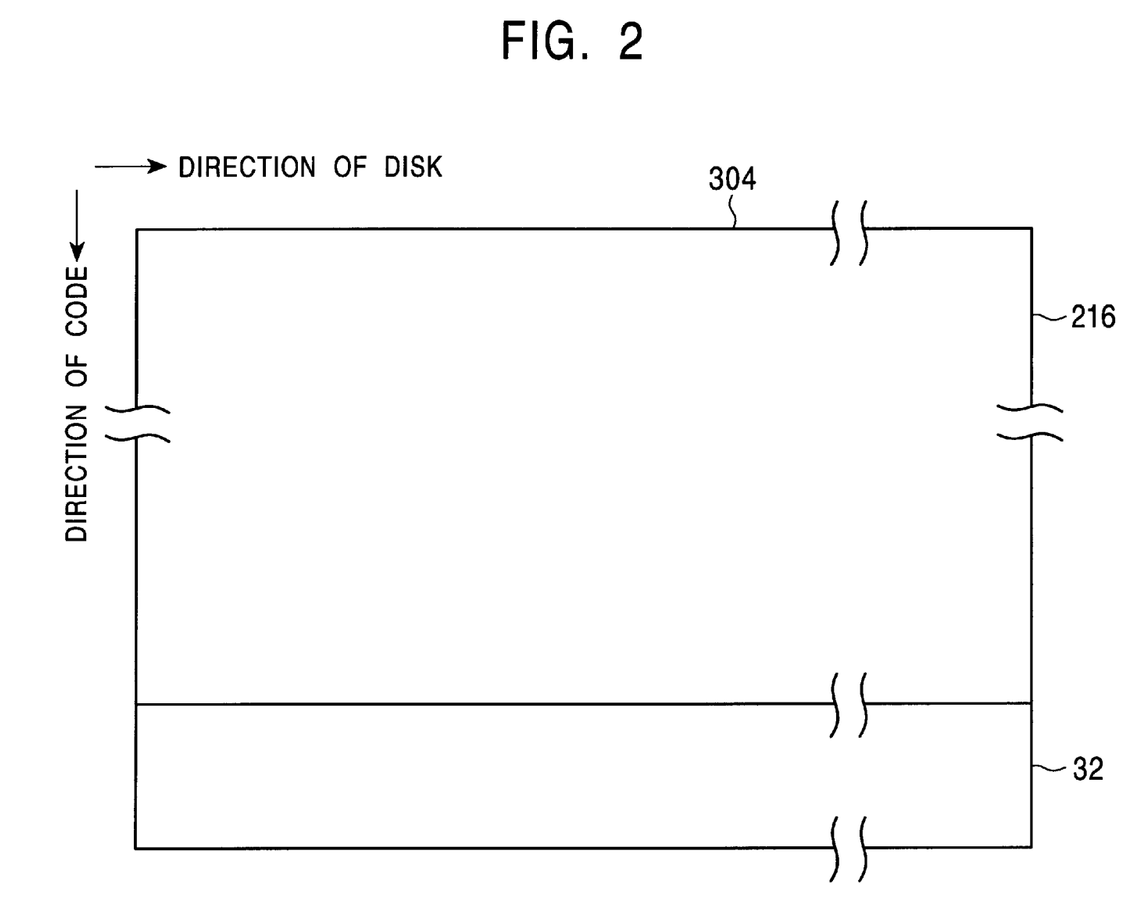
FIG. 2 is a format diagram of an ECC block used in the optical disk apparatus.

The ECC block shown in FIG. 2 has a RS code of (248.216.33) and it is obtained by joining 304 codes, each of which includes 216 information words and 32 parity words. The code length is 248 words (216 information words and 32 parity words) and the interleave length is 304, which is quite a large code for one using GF ($2^8$). When there is no correcting margin, up to 16 words can be corrected for each code. The information words consist of 216×304/code block. For example, in a construction in which there are (2048/data+4/check code)×32 sectors, the user data consists of 2K×32=64 KB/block.

During writing, the error correcting circuit 8 applies interleave processing to the data of ECC blocks generated in the above described manner, adds 32 words of control data (parity) to each of the ECC blocks, and outputs them.

During reading, the error correcting circuit 8 applies de-interleave processing to read data D which is demodulated by a modulation/demodulation circuit 6 and which is stored via the arbiter 7 in the buffer memory 9. Furthermore, the error correcting circuit 8 performs error correcting processing on the read data D in units of ECC blocks and selectively outputs the user data D to the buffer memory 9 based on results of the processing. Some concrete examples of the error correcting circuit 8 are described below.

During writing, the modulation/demodulation circuit 6 modulates the output data of the error correcting circuit 8 using an appropriate modulation method for the optical disk 3, converts the modulation data into a sequence of serial data, and outputs the converted data. During reading, the modulation/demodulation circuit 6 demodulates the output data of the writing/reading circuit 5 into the read data D and outputs the read data D in parallel.

During writing, the writing/reading circuit 5 receives the modulation signal in accordance with the serial data output from the modulation/demodulation circuit 6 and writes the serial data to the optical disk 3 by intermittently increasing the intensity of the laser beam output from the optical pickup 2. During reading, the writing/reading circuit 5 forms the waveform of the read signal, converts it into a binary number, and identifies the read signal, whereby the read data including the serial data is obtained.

The error correcting circuit 8 is described in detail.

Basically, the error correcting circuit 8 applies de-interleave processing to the data stored using the code block of the ECC format shown in FIG. 2 and then performs a first error correcting processing. Furthermore, the error correcting circuit 8 performs second error correcting processing on the code that cannot be corrected during the first error correcting processing by adding remove information thereto.

Errors consist of random errors and burst errors. For the sake of simplicity, there is no error correcting margin when error correcting is performed.

Figure 3:
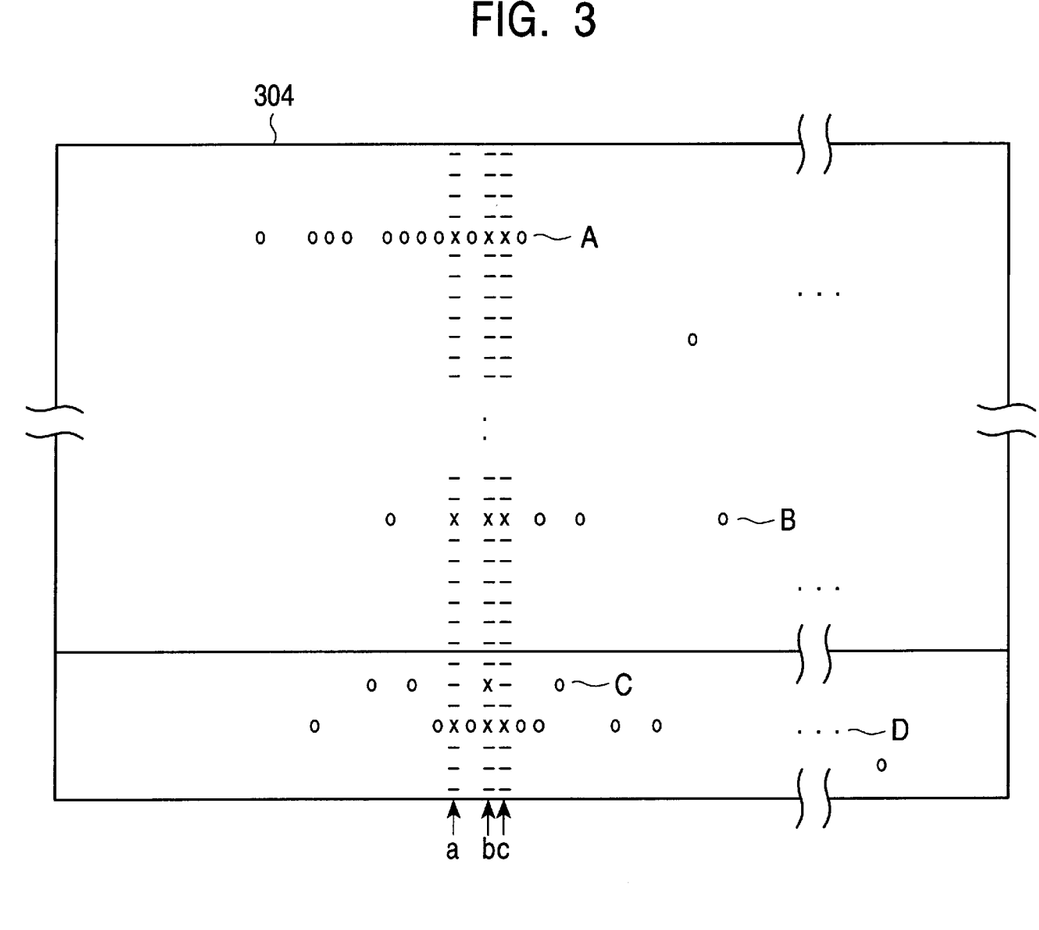
FIG. 3 is a diagram illustrating operations, according to a first concrete example, of an error correcting circuit which is an important part of the optical disk apparatus.

When the error correcting circuit 8 performs the second error correcting processing, which is the remove correcting, the remove information is added to a word belong to the row having the highest number of error-corrected words among the codes corrected during the first error correcting processing. A first concrete example is described with reference to FIG. 3. In FIG. 3, 17 erroneous words are assumed to exist in each of codes "a", "b", and "c" that cannot be error-corrected.

When the first error correcting, which is normal correcting, is performed, the locations and the sizes of errors can be identified. Accordingly, when the errors can be corrected, originally incorrect but currently corrected words can be identified. Such words are indicated by "O" in FIG. 3. No-error words of each of the codes that need not be error-corrected are indicated by "–". Erroneous words of each of the codes that cannot be error-corrected are indicated by "X".

For each row in the direction of the disk in FIG. 3, the number of words marked with "O" is counted for each row of the optical disk. Row "A" having the highest number of corrected words and row "D" having the second highest number of corrected words are identified.

Figure 4:
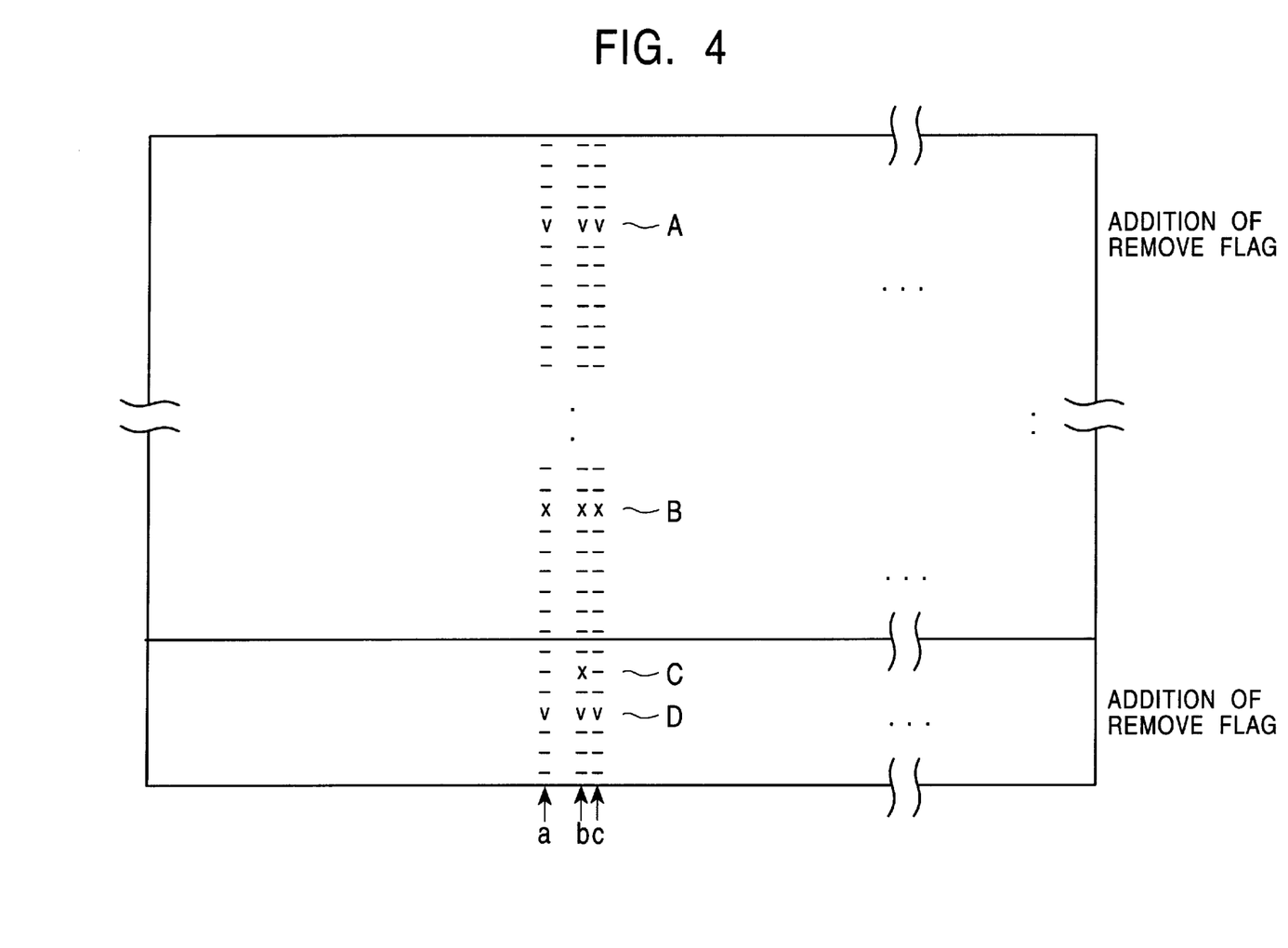
FIG. 4 is a diagram showing addition of remove flags during the operations shown in FIG. 3.

As shown in FIG. 4, by adding remove flags "V" to words which correspond to the above two rows, the second error correcting processing (remove correcting processing) is performed on codes which cannot be corrected during the first error correcting processing (normal correcting).

Each of the codes "a", "b", and "c" which cannot be corrected during the first error correcting processing has 17 erroneous words, among which two words have the remove flag "V" added thereto. That is, the location of 15 erroneous words cannot be identified and the location of two erroneous words can be identified. A code having a distance of 33 can correct these errors. After the first error correcting processing is performed on 304 codes, since the second error correcting processing is performed on only four rows of codes, the total amount of time required for the first and second error correcting is not significantly increased.

A case is considered in which 18 words of error exist in the codes which cannot be corrected during the first error correcting processing. Even the use of the second error correcting processing (remove correcting processing) cannot lead to correction of the above errors. Therefore, the remove flags are added. In addition to the rows A and D, rows B and C having the third highest and the fourth highest number, respectively, of corrected words are identified. By adding remove flags "V" to words which belong to the codes which cannot be error-corrected and which correspond to the above four rows, the remove correction processing is performed. The codes that cannot be corrected during the first error correcting have 18 erroneous words, among which four words have the remove flags added thereto. That is, the locations of 14 erroneous words cannot be identified and the locations of four erroneous words can be identified, whereby these words can be corrected by a code having a distance of 33.

Figure 5:
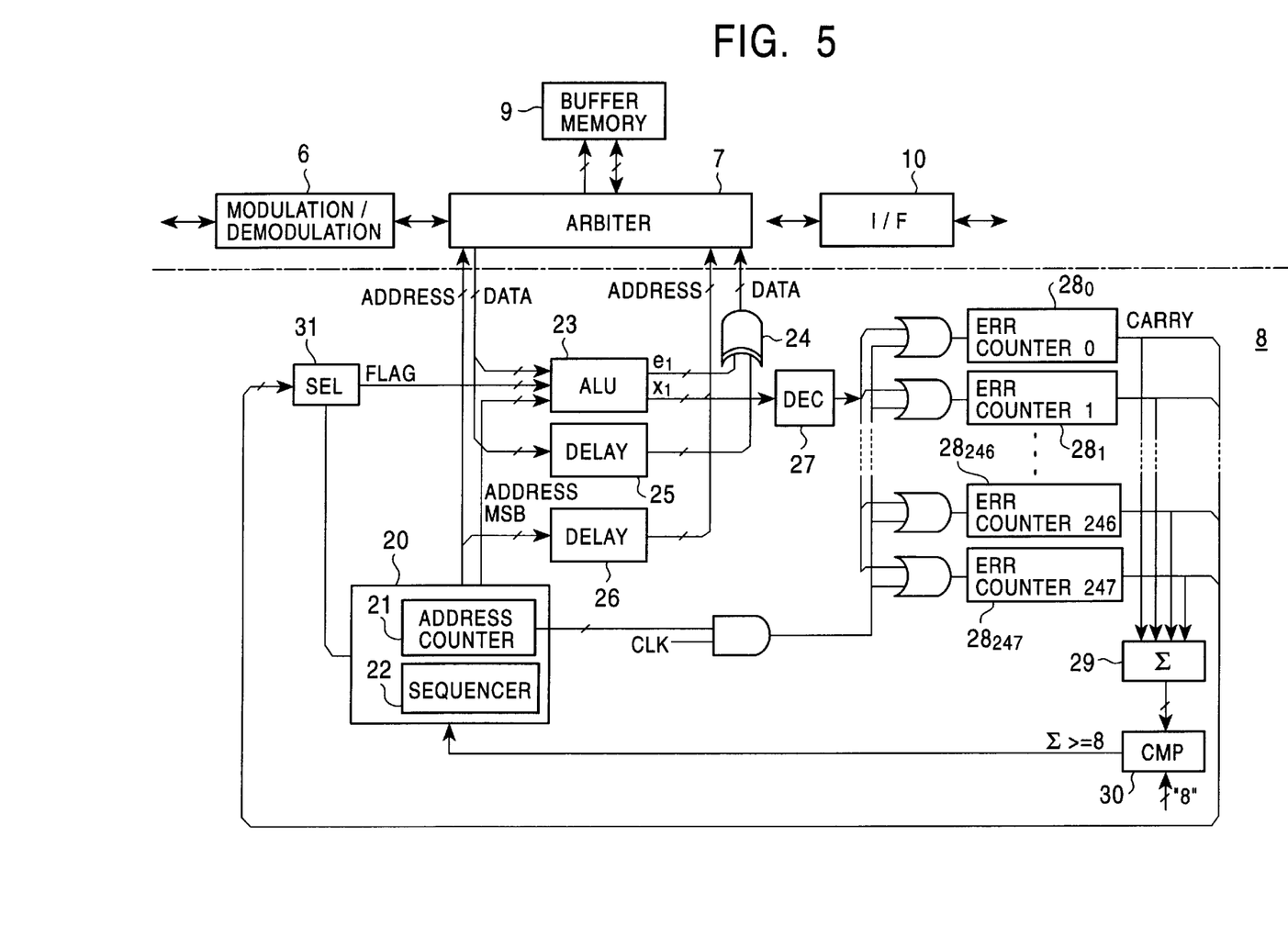
FIG. 5 is a block diagram of the detailed construction of the error correcting circuit and peripheral devices thereof for performing the operations according to the first concrete example.

FIG. 5 shows the detailed construction of the error correcting circuit 8, which performs operations according to the first concrete example, and the connection relationship between the circuit 8 and peripheral devices thereof.

The error correcting circuit 8 includes an address counter 21 for generating a memory address, and a sequencer 22. The address counter 21 and the sequencer 22 constitute a control unit 20 for controlling the entirety of the circuit which performs error correcting operations.

The arbiter 7 causes read data from the optical disk 3 to be stored in the buffer memory 9. The read data is read as a stream of codes in accordance with an address from the address counter 21 and is input to an Arithmetic Logic Unit (ALU) 23.

The first error correcting processing is performed by causing an Exclusive-OR circuit 24 to apply an Exclusive-OR operation to the data corresponding to error location "$X_i$" obtained by the ALU 23 and error size "$e_i$". The result of the operation is input to the buffer memory 9. At this time, data and the address are delayed by delay circuits 25 and 26 for the time required for computation so as to be timed for the subsequent processing.

Conventionally, the first error correcting processing (normal correcting processing) is performed on the entirety of the codes and error detection is performed in units of error detecting codes based on a certain unit. After the processing, the data is output via the I/F 10 from the buffer memory 9 to an application side.

The error correcting circuit 8 counts the number of corrected words for each row. Error counters $28_0$ to $28_{247}$ are provided for each row 0 to 247 of the disk, that is, each word 0 to 247 of the code, respectively.

Initially, the contents of error counters $28_0$ to $28_{247}$ are cleared before the normal error correcting processing of the ECC block is started. Whenever an error is detected during the normal correcting processing, a decoder 27 outputs a clock to the counter $28_i$ corresponding to the location of the occurrence of the error, so that the content of the corresponding error counter $28_i$ is incremented. Each error counter $28_n$ can count up to 304.

When normal correcting processing is terminated, each counter contains the number of errors which occurred. When the content of each counter continues to be incremented, the error counter whose content becomes the maximum value (that is, carry is set) fastest is the counter corresponding to a row which has the most errors corrected. Here, the content of each counter continues to be incremented until the number of error counters whose carries are set becomes eight. That is, by causing an adder 29 to sum the total of the carries from the error counters and a comparator 30 to compare the output of the adder 29 with a reference value 8, it can be determined whether the number of error counters $28_n$ having the carry set is eight.

When the rows corresponding to the eight carries are identified, the remove correcting processing (the second error correcting processing) is performed in accordance with the sequencer 22.

The remove correcting processing is performed on the codes that cannot be error-corrected during the normal correcting. Here, the codes that can be error-corrected during the normal correcting are stored in some region of registers or the buffer memory 9. When a selector 31 causes a word number corresponding to an error counter whose carry is set to accord with the output of the address counter 21, the remove flag is set and the ALU 23 performs the remove correcting processing. The corrected data is written in the buffer memory 9 in the same manner as in the normal correcting processing.

There are shown the case in which only 17 erroneous words exist in each of the codes that cannot be corrected and the case in which only 18 erroneous words exist in each of the codes that cannot be corrected. When codes having 17 erroneous words and codes having 18 erroneous words coexist, the first remove correcting processing corrects a code system consisting of codes having 17 erroneous words. The number of the corrected words is increased according to the results of this remove correcting processing and further remove correcting processing continues to be performed. Accordingly, more precise detection of burst errors can be performed.

The remove flags are newly set based on the number of words corrected during such prior correcting processing (which means at least the first remove correcting processing and which includes the subsequent second correcting processing). The correcting ability can be increased by repeating the correcting processing using the newly set remove flags.

The present invention is effective when the errors include burst errors. In fact, when the optical disk is formed at high density, the errors which cause problems are burst errors due to dust and flaws. Even when excessive errors occur, they occur mostly due to an increase in the number of burst errors.

A second concrete example is described in which the remove correcting is performed on the codes which cannot be corrected during the first error correcting processing (normal correcting processing) by adding remove flags to words corresponding to rows having a predetermined number of words marked with "O" or greater.

Since random errors normally occur less frequently, a threshold value is established based on the probability of occurrence of the random errors. The occurrence of burst errors should be determined when a predetermined number or more of errors occur. For example, the threshold value may be established between 8 and 16 out of 304 rows. Adopting this method can simplify the hardware configuration.

For example, when remove flags are added to all of the rows having not less than eight words normally corrected during the first error correcting processing, 248 four-bit counters (counting up to eight) suffice as the error counters shown in FIG. 5. When the operations according to the first concrete example are performed, 248 nine-bit counters (counting up to 304) are required. Since there is no need to perform addition of carries and comparison of the result of the addition, the adder 29 and the comparator 30 shown in FIG. 5 are not required. Instead, the carry signals of the error counters should be directly input to the selector 31 in which the carry signal of each counter is set to be output when the content thereof becomes eight.

A third concrete example is described in which the remove correcting is performed by adding remove flags to the words that correspond to the rows having the corrected words which are marked with "O" and a pair of which are on both adjacent sides of uncorrectable codes during the first error correcting processing or in the proximity of these adjacent sides.

In FIG. 3, among the row "A" having the highest number of corrected words and the row "D" having the second highest number of corrected words, the words are corrected on both adjacent sides of the uncorrectable code "a" during the first error-correcting. Accordingly, remove flags can be added to the words of the rows "A" and "D", whereby the remove correcting can be performed. Likewise, remove correcting can be performed by adding remove flags to the codes "b" and "c" which cannot normally be corrected.

Figure 6:
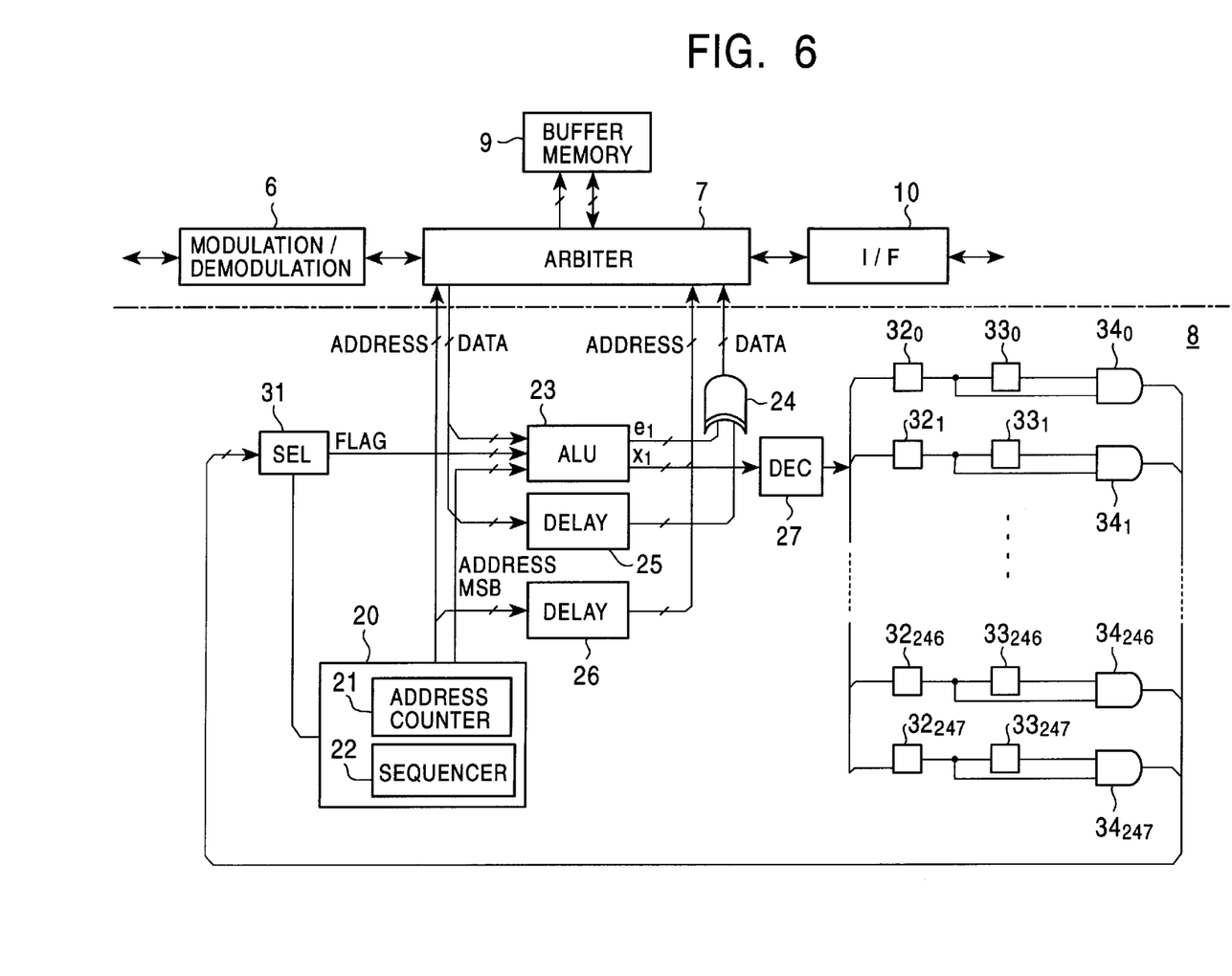
FIG. 6 is a block diagram of the detailed construction of the error correcting circuit and peripheral devices thereof for performing the operations according to a third concrete example.

FIG. 6 shows the detailed construction of the error correcting circuit 8, which performs operations according to the third concrete example, and the connection relationship between the circuit 8 and peripheral devices thereof.

In FIG. 6, the connection relationship among the control unit 20 including the address counter 21 and the sequencer 22, the ALU 23, the Exclusive-OR gate 24, the delay circuits 25 and 26, the decoder 27, and the selector 31 is the same as that shown in FIG. 5.

In this example, the words corrected during the first error correcting processing are stored in registers (flip-flops).

Flip-flops $32_0$ to $32_{247}$ corresponding to the rows 0 to 247 of the disk, that is, the words 0 to 247 of the code, respectively, are provided, whereby normally corrected results are stored therein.

During the normal correcting of the next code, the contents of the flip-flops $32_0$ to $32_{247}$ are shifted to flip-flops $33_0$ to $33_{247}$, respectively, and the newly corrected results are stored in the corresponding flip-flops $32_0$ to $32_{247}$. However, when this next code cannot be corrected, shifting of each of the flip-flops $32_0$ to $32_{247}$ is not performed.

When the next code to be corrected is correctable, the contents of the flip-flops $32_0$ to $32_{247}$ are shifted to flip-flops $33_0$ to $33_{247}$, respectively, and the newly corrected results are stored in the corresponding flip-flops $32_0$ to $32_{247}$.

Since the above operations cause the corrected results on both adjacent sides of the code that cannot be corrected during the first correcting processing to remain in the flip-flops $32_0$ to $32_{247}$, the remove flags are created using these corrected results and the second error correcting processing (remove correcting processing) is performed on the uncorrectable code between these corrected results.

In this third concrete example, the outputs of the flip-flops $32_0$ to $32_{247}$ and the corresponding outputs of the flip-flops $33_0$ to $33_{247}$ are ANDed at AND gates $34_0$ to $34_{247}$. The ALU 23 corrects this uncorrectable code by adding the remove flags to the outputs of the AND gates $34_0$ to $34_{247}$.

This allows the remove correcting to be performed concerning (code "a", row "A") and (code "a", row "D"), or (codes "b" and "c", row "A") and (codes "b" and "c", row "D").

A fourth concrete example is described in which the remove correcting is performed by adding the remove flags to normally uncorrectable words which are in the proximity of a series of normally uncorrectable codes and which have a word marked with "O" in the same row as that of the normally uncorrectable words.

That is, even when a word is corrected in the same row as that of a word which is not adjacent to but in the proximity of the uncorrectable code, the occurrence of burst errors is determined. For example, in the rows "B" and "C" shown in FIG. 4, by adding the remove flags, remove correcting can be performed.

Figure 7:
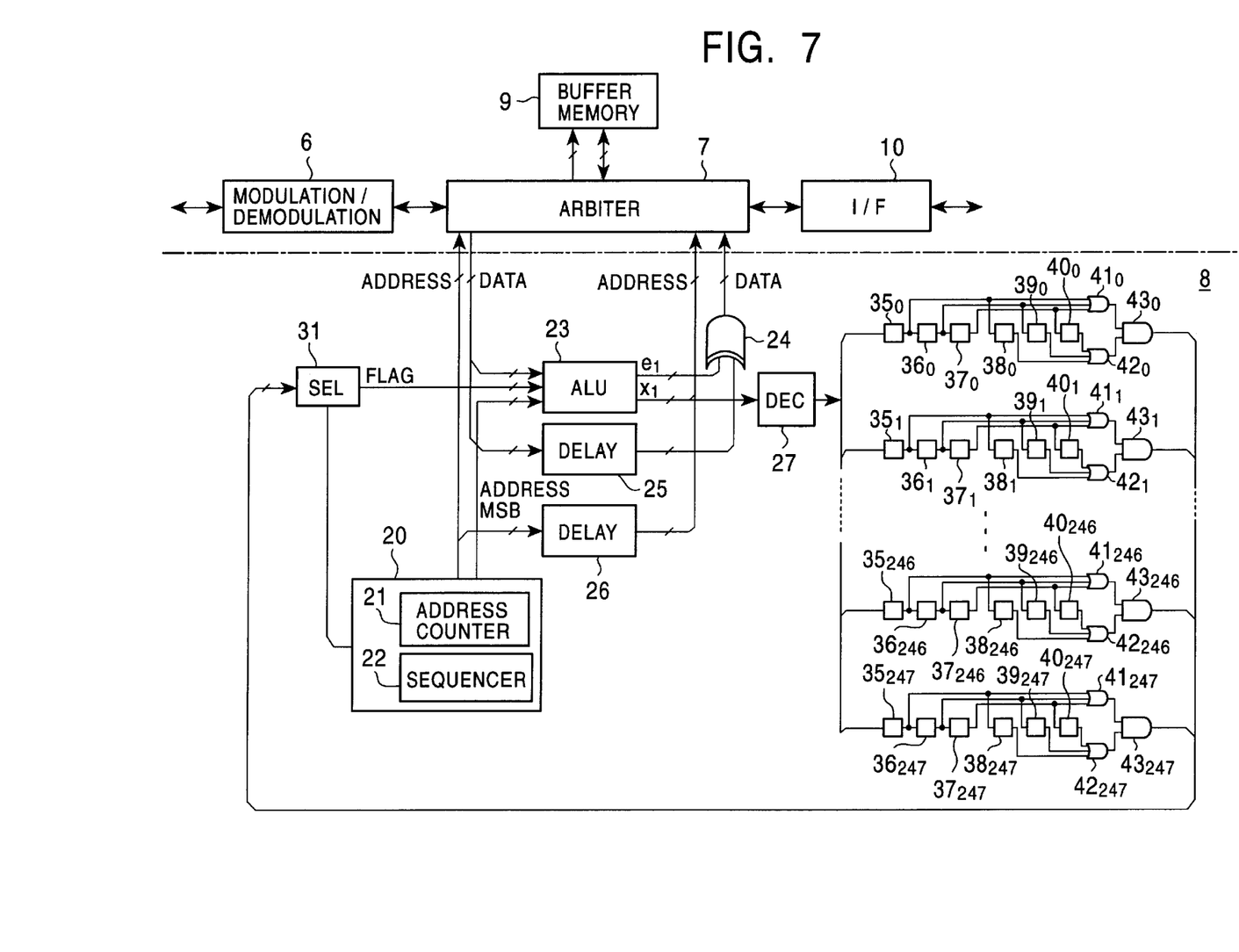
FIG. 7 is a block diagram of the detailed construction of the error correcting circuit and peripheral devices thereof for performing the operations according to a fourth concrete example.

FIG. 7 shows the detailed construction of the error correcting circuit 8, which performs operations according to the fourth concrete example, and the connection relationship between the circuit 8 and peripheral devices thereof.

In FIG. 7, the connection relationship among the control unit 20 including the address counter 21 and the sequencer 22, the ALU 23, the Exclusive-OR gate 24, the delay circuits 25 and 26, the decoder 27, and the selector 31 is the same as that shown in FIG. 5.

In this example, by providing a plurality of flip-flops (three flip-flops as a set in FIG. 7) such as flip-flops 35, 36, and 37 or flip-flops 38, 39, and 40, even when a word is corrected in the same row as that of a word which is not immediately adjacent to but in the proximity of an uncorrectable code, occurrence of the burst error can be determined.

When the code cannot be corrected, the contents of a group of the flip-flops 35, 36, and 37 are not shifted to a group of the flip-flops 38, 39, and 40.

When the code can be corrected, the content of the group of the flip-flops 35, 36, and 37 are shifted to the group of the flip-flops 38, 39, and 40 and the newly corrected results are stored in the group of flip-flops 35, 36, and 37.

In a case in which the uncorrectable code "a", a correctable code, and uncorrectable codes "b" and "c" line up as shown in FIG. 3, the codes between the codes "a" and "c" are considered as a series of uncorrectable codes. While correcting is performed on the codes "a" to "c", the contents of the group of the flip-flops 35, 36, and 37 are not shifted to the group of the flip-flops 38, 39, and 40. When correcting is performed on a next correctable code, the contents of the group of the flip-flops 35, 36, and 37 are shifted to the group of the flip-flops 38, 39, and 40, and newly corrected results are stored in the group of the flip-flops 35, 36, and 37. In the codes "b" and "c" shown in FIG. 3, this enables remove correcting to be performed by adding remove flags.

The remove flag may be generated using not only corrected results of the code but also detection information of a synchronizing signal such as FS (a frame synchronizing signal). When the position of the FS corresponds to immediately before (or in the proximity of) the code which cannot be corrected during the normal correcting and there is a row having no FS detected, the possibility of occurrence of an error in this row may be considered. Accordingly, this case can be handled in the same manner as the case in which the error is immediately before the normally uncorrectable code. When the position of the FS corresponds to immediately after (or in the proximity of) the code which cannot be corrected during the normal correcting and there is a row having no FS detected or a row having the position of the FS shifted, the possibility of occurrence of an error in this row may be considered. Accordingly, this case can be handled in the same manner as the case in which the error is immediately after the normally uncorrectable code.

The FS does not necessarily have one-to-one correspondence with a unit for a row of the disk, that is, a word of the code. When an uncorrectable code extends from the last part of a row to the first part of its next row, or when the corrected words on both sides of the uncorrectable code are not in the same row in which a first word belongs to the previous row of a second word, it is considered that a burst error occurs in this extending part of the rows. Accordingly, by adding the remove flags to the words in the extending part, combined correcting can be performed.

Even though the word number of each code does not agree with the order of the rows of the disk, as long as the word number can be determined based on a certain transformation rule, the remove flags can be added to the corresponding words of each code using this transformation rule. Accordingly, combined correcting can be performed.

Although illustrative embodiments of the present invention and modifications thereof have been described in detail herein, it is to be understood that this invention is not limited to these precise embodiments and modifications, and that other modifications and variations may be affected therein by one skilled in the art without departing from the scope and spirit of the invention as defined by the appended claims.

What is claimed is:

1. An optical disk apparatus for reading data written in an optical disk in units of code blocks arranged by joining a plurality of correcting codes, said optical disk apparatus comprising:

reading means for reading the code block from said optical disk; and error correcting means for combining first error correcting processing performed on the code block read by said reading means with second error correcting processing performed by adding remove information to codes that cannot be corrected during at least said first error correcting processing, wherein, during said second error correcting processing, said error correcting means adds said remove information to a word that belongs to a row of said optical disk having a large number of error-corrected words among the codes that can be corrected during said first error correcting processing.

2. An optical disk apparatus for reading data written in an optical disk in units of code blocks arranged by joining a plurality of correcting codes, said optical disk apparatus comprising:

reading means for reading the code block from said optical disk; and error correcting means for combining first error correcting processing performed on the code block read by said reading means with second error correcting processing performed by adding remove information to codes that cannot be corrected during at least said first error correcting processing, wherein, during said second error correcting processing, said error correcting means adds said remove information to a word that belongs to a row of said optical disk having not less than a predetermined number of error-corrected words among the codes that can be corrected during said first error correcting processing.

3. An optical disk apparatus for reading data written in an optical disk in units of code blocks arranged by joining a plurality of correcting codes, said optical disk apparatus comprising:

reading means for reading the code block from said optical disk; and error correcting means for combining first error correcting processing performed on the code block read by said reading means with second error correcting processing performed by adding remove information to codes that cannot be corrected during at least said first error correcting processing, wherein during said second error correcting processing, said error correcting means adds said remove information to a pair of words that is on both adjacent sides of an uncorrectable code or in the proximity of the adjacent sides, that is corrected, and that belongs to the same row of said optical disk.

4. An optical disk apparatus for reading data written in an optical disk in units of code blocks arranged by joining a plurality of correcting codes, said optical disk apparatus comprising:

reading means for reading the code block from said optical disk; and error correcting means for combining first error correcting processing performed on the code block read by said reading means with second error correcting processing performed by adding remove information to codes that cannot be corrected during at least said first error correcting processing, wherein said error correcting means performs another second error correcting processing by adding new remove information to the codes that cannot be error-corrected during said second error correcting processing performed immediately after said first error correcting processing.

5. An optical disk apparatus for reading data written in an optical disk in units of code blocks arranged by joining a plurality of correcting codes said optical disk apparatus comprising:

reading means for reading the code block from said optical disk; and error correcting means for combining first error correcting processing performed on the code block read by said reading means with second error correcting processing performed by adding remove information to codes that cannot be corrected during at least said first error correcting processing, wherein said error correcting means uses detection information on a synchronizing signal when said remove information is added.

* * * * *